(12) United States Patent
Chen et al.

(10) Patent No.: US 9,116,191 B2
(45) Date of Patent: Aug. 25, 2015

(54) VOLTAGE-DROP TESTING SYSTEM, VOLTAGE-DROP CONTROL APPARATUS, AND METHOD THEREOF

(75) Inventors: Tsung-Yuan Chen, New Taipei (TW); Kuei-Chih Hou, New Taipei (TW); Wen-Kai Chiang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 629 days.

(21) Appl. No.: 13/421,858

(22) Filed: Mar. 15, 2012

(65) Prior Publication Data

US 2013/0120001 A1 May 16, 2013

(51) Int. Cl.
*G01R 31/02* (2006.01)
*G01R 31/00* (2006.01)

(52) U.S. Cl.
CPC ............ *G01R 31/001* (2013.01); *G01R 31/002* (2013.01)

(58) Field of Classification Search
CPC .............................. G01R 31/001; G01R 31/002
See application file for complete search history.

(56) References Cited

PUBLICATIONS

Immunity testing using IEC 61000-4-11, SL Power Electronics AN-144, May 2009, available at http://www.slpower.com/reference/AN144%20EN61000-4-11.pdf.*
Chroma Programmable AC Power Source (Chroma), available at http://www.chromausa.com/pdf/6500-E.pdf on Mar. 26, 2010.*
Labview, Jan. 31, 2011, available at http://en.wikipedia.org/wiki/Labview.*
Chroma 65XX Series Power Supply, Certified LabVIEW Plug and Play (project-style) Instrument Driver, Jul. 2009, available at http://sine.ni.com/apps/utf8/niid_web_display.download_page?p_id_guid=70564633920357C4E04400144FB7D21D#seeBelow.*
Use a Table Control to write to and read from Spreadsheet (XLS) file in LabVIEW 8.6, Feb. 17, 2009, available at https://decibel.ni.com/content/docs/DOC-3460.*
Application Note #116B, IEC AC Immunity Testing using the iX Series, 1998, available at http://www.programmablepower.com/Application_Notes/app_downloads/App116b_IEC_AC_Power_immunity_testing.pdf.*

* cited by examiner

*Primary Examiner* — Melissa Koval
*Assistant Examiner* — Daniel Miller
(74) *Attorney, Agent, or Firm* — Novak Druce Connolly Bove + Quigg LLP

(57) ABSTRACT

A voltage-drop testing system, including a voltage-drop control apparatus, and a voltage-drop testing method adapted for the voltage-drop testing system based on LABVIEW department platform. When the LABVIEW department platform 12 is running, different groups of test data may be transferred to the PLD tester 20, when the PLD tester 20 finishes the testing based on all groups of test data, the PLD tester 20 feeds back the test results to the LABVIEW department platform 12, and the LABVIEW department platform 12 creates the voltage-drop testing graphic frame displaying the test results for the electronic device under test 2 for the convenience of a user.

6 Claims, 5 Drawing Sheets

| Voltage-drop percentage | Test time | | | | | | | | | | | |
|---|---|---|---|---|---|---|---|---|---|---|---|---|
| | 25ms | 60ms | 90ms | 130ms | 200ms | 400ms | 600ms | 900ms | 1.3s | 2s |
| | Supply voltage 100V/60Hz | | | | | | | | | |
| -40% | | | | | | | | | | |
| -50% | | | | | | | | | | |
| -60% | | | | | | | | | | |
| -70% | | | | | | | | | | |
| -80% | | | | | | | | | | |
| -90% | | | | | | | | | | |
| -100% | | | | | | | | | | |
| | Supply voltage 200V/50Hz | | | | | | | | | |
| -70% | | | | | | | | | | |
| -80% | | | | | | | | | | |
| -90% | | | | | | | | | | |
| -100% | | | | | | | | | | |
| Test result: | | | | | | | | | | |

FIG. 1 (prior art)

| | 25ms | 60ms | 90ms | 130ms | 200ms | 400ms | 600ms | 900ms | 1.3s | 2s | State |
|---|---|---|---|---|---|---|---|---|---|---|---|
| 100V/60Hz | | | | | | | | | | | |
| -40% | pass | pass | pass | pass | pass | pass | pass | pass | pass | pass | pass |
| -50% | pass | fail | wait | wait | wait | wait | wait | wait | wait | wait | fail |
| -60% | wait | wait | wait | wait | wait | wait | wait | wait | wait | wait | |
| -70% | wait | wait | wait | wait | wait | wait | wait | wait | wait | wait | |
| -80% | wait | wait | wait | wait | wait | wait | wait | wait | wait | wait | |
| -90% | wait | wait | wait | wait | wait | wait | wait | wait | wait | | |
| -100% | wait | wait | wait | wait | wait | wait | wait | wait | wait | | |
| 200V/50Hz | | | | | | | | | | | |
| -70% | wait | wait | wait | wait | wait | wait | wait | wait | wait | wait | |
| -80% | wait | wait | wait | wait | wait | wait | wait | wait | wait | wait | |
| -90% | wait | wait | wait | wait | wait | wait | wait | wait | wait | wait | |
| -100% | wait | wait | wait | wait | wait | | | | | | |

FIG. 4

VOLTAGE-DROP TESTING SYSTEM, VOLTAGE-DROP CONTROL APPARATUS, AND METHOD THEREOF

BACKGROUND

1. Technical Field

The disclosure relates to test systems and, more particularly, to a voltage-drop testing system, a voltage-drop control apparatus, and a voltage-drop testing method adapted for the voltage-drop testing system based on a test development platform, such as a development platform sold under a trademark LABVIEW®.

2. Description of Related Art

Electronic devices must be tested before they leave factory, a tester needs to do an electromagnetic interference (EMI) test for each electronic device, such as, a power line disturbance (PLD) test. Before a PLD tester does the test, a record table may be prepared by a user as shown in FIG. 1. After the PLD tester does the test for the electronic device, the user must manually input all test results into the record table, this is very inconvenient for the user and wastes a lot of time.

Therefore, what is needed is a voltage-drop testing system based on a test development platform to overcome the described shortcoming.

BRIEF DESCRIPTION OF THE DRAWINGS

FIG. 1 is a schematic view of a record table for doing a voltage-drop test according to prior art.

FIG. 4 is a schematic view of a voltage-drop testing graphic frame compiled by a test development platform of the voltage-drop testing system of FIG. 1.

DETAILED DESCRIPTION

Figure 2:
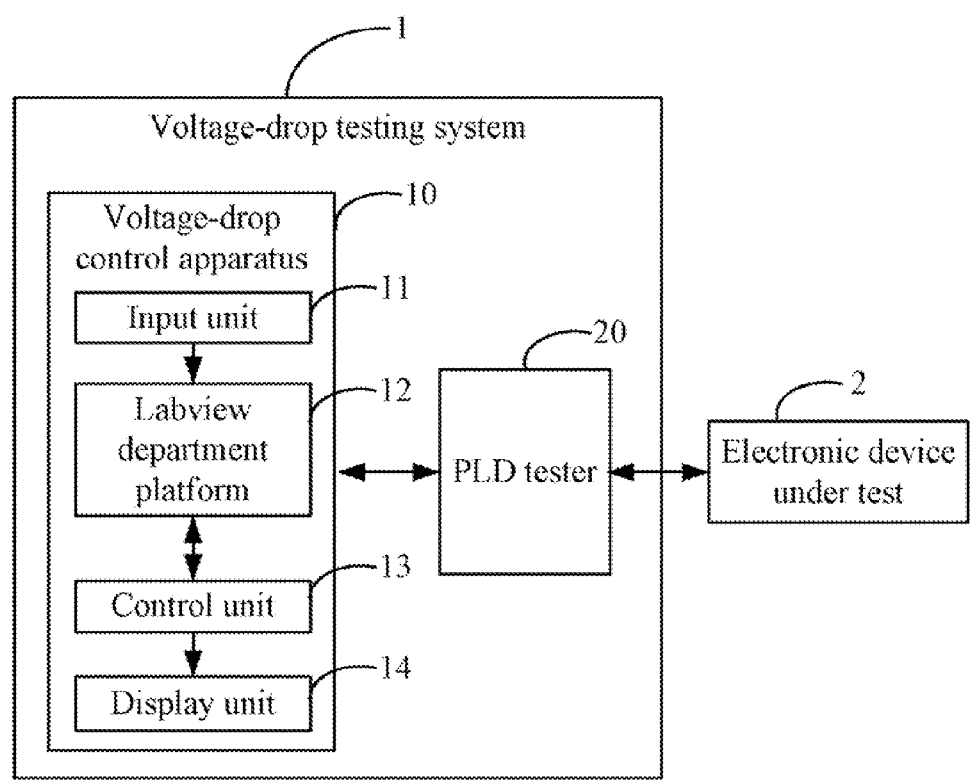
FIG. 2 is a block diagram of a voltage-drop testing system in accordance with an exemplary embodiment.

FIG. 2 is a block diagram of a voltage-drop testing system in accordance with an exemplary embodiment. The voltage-drop testing system 1 is utilized to do an electromagnetic interference (EMI) test for an electronic device under test 2. The voltage-drop testing system 1 includes a voltage-drop control apparatus 10 and a power line disturbance (PLD) tester 20. The voltage-drop control apparatus 10 may be a computer. The PLD tester 20 is electrically connected with the electronic device under test 2. The voltage-drop testing system 1 runs in an environment including the PLD tester 20 and a test development platform 12. In the embodiment, the test development platform 12 can be a development platform sold under a trademark LABVIEW®. The voltage-drop control apparatus 10 runs on the test development platform 12. When receiving test data from the voltage-drop control apparatus 10, the PLD tester 20 starts to do the test for the electronic device under test 2.

Figure 3:
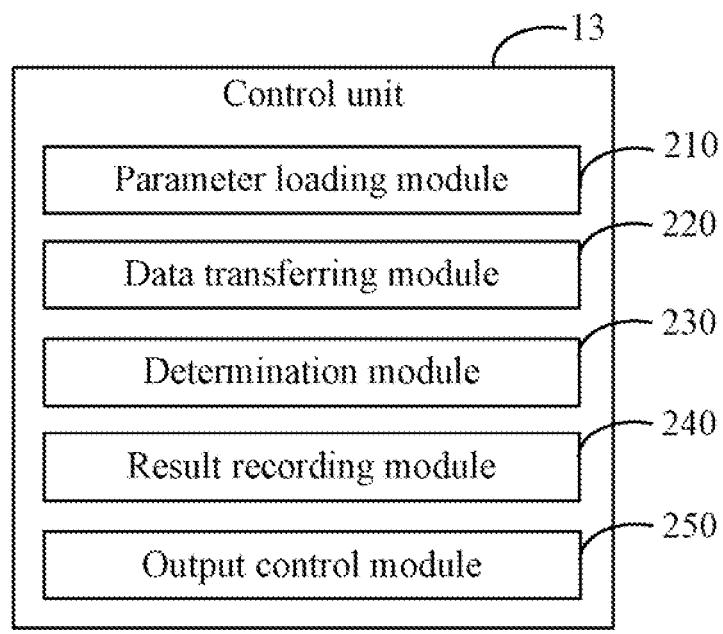
FIG. 3 is a block diagram of a control unit of a voltage-drop control apparatus of the voltage-drop testing system of FIG. 1.

The voltage-drop control apparatus 10 includes an input unit 11, a control unit 13, and a display unit 14. The input unit 11 generates input signals in response to user inputs. The display unit 14 displays information. As shown in FIG. 3, the control unit 13 includes a parameter loading module 210, a data transferring module 220, a determination module 230, a result identifying module 240, and an output control module 250.

The test development platform 12 compiles a voltage-drop testing graphic frame shown in FIG. 4 by the way of a graphical programming control method. The voltage-drop testing graphic frame defines a parameter testing area and a test results area. As shown in FIG. 4, the parameter testing area includes a supply voltage category 3, a listing of voltage-drop percentages 4, and increasing test times 5. The voltage-drop testing graphic frame further defines a starting mark "TEST" 8 and a stopping mark "STOP" 9.

The parameter loading module 210 is configured to load test data to the parameter testing area in the voltage-drop testing graphic frame in response to user inputs from the input unit 11. For example, the test data may include a supply voltage, such as 200V, four voltage-drop percentages, such as −70%, −80%, −90%, and −100%, and a number of test duration times, such as 25 milliseconds (25 ms), 60 ms, 90 ms . . . 2s.

When the starting mark "TEST" 8 is triggered in response to user inputs, the data transferring module 220 is configured to transfer the test data in the parameter testing area in groups to the PLD tester 20 in a particular order. Each group of test data includes a supply voltage, a voltage-drop percentage, and a test time. For example, the data transferring module 220 may transfer a group of test data (supply voltage 200V, voltage-drop percentage 70%, and test time 60 ms) to the PLD tester 20 and the PLD tester 20 starts to apply the test to the electronic device under test 2 based on the transferred group of test data. The determination module 230 is configured to determine whether an electrical signal is received from the PLD tester 20 within a predefined period of time after the test time of the group of test data has been reached.

When receiving a group of test data, the supply voltage of the PLD tester 20 is decreased according to the voltage-drop percentage of the group of test data, and the PLD tester 20 is turned off during the test time of the group of test data. If after the test time the PLD tester 20 immediately restarts, that is, the electronic device under test 2 passes the test based on the group of test data, and the test results area corresponding to the group of test data records a passing or failing state of "pass" as in label 6 in FIG. 4. If after the test time the PLD tester 20 does not restart and the PLD tester 20 needs to be turned on manually, that is, the test of the electronic device under test 2 is not passed based on the group of test data and the passing or failing state of the test results area records a "fail" as in label 7.

When the PLD tester 20 immediately restarts and the test of the electronic device under test 2 is successful based on the group of test data, the PLD tester 20 will generate an electrical signal to the voltage-drop control apparatus 10 and the determination module 230 will determine whether or not the electrical signal is received from the PLD tester 20 within the predefined period of time after the test time of the group of test data. The result recording module 240 is configured to record a test result of passing in the test results area corresponding to the group of test data, and the data transferring module 220 transfers another group of test data in the voltage-drop testing graphic frame to the PLD tester 20, for example, the supply voltage now being 200V, the voltage-drop percentage now at −80%, and test time now 60 ms. When the electrical signal is not received within the predefined period of time from the PLD tester, the result recording module 240 is further configured to record a "fail" test result in the test results area corresponding to the group of test data, and the data transferring module 220 is further configured to cease transferring groups of test data to the PLD tester 20.

Therefore, once the PLD tester 20 passes the test based on one group of test data, the data transferring module 220 transfers another group of test data in the voltage-drop testing graphic frame to the PLD tester 20. If the PLD tester 20 passes every test based on all groups of test data in the voltage-drop testing graphic frame, the voltage-drop test for the electronic device under test 2 is at an end and passes. If the PLD tester 20 fails one group of test data, the data transferring module 220 ceases transferring groups of subsequent test data in the voltage-drop testing graphic frame, and the voltage-drop test for the electronic device under test 2 ends in failure.

The result recording module 240 records all test results in the test results area corresponding to each group of test data. The test development platform 12 is triggered to activate the "STOP" mark 9, thereby creating the voltage-drop testing graphic frame of the electronic device under test 2, and the output control module 250 is configured to output each test result and control the display unit 14 to display each test result in the test results area.

Figure 5:
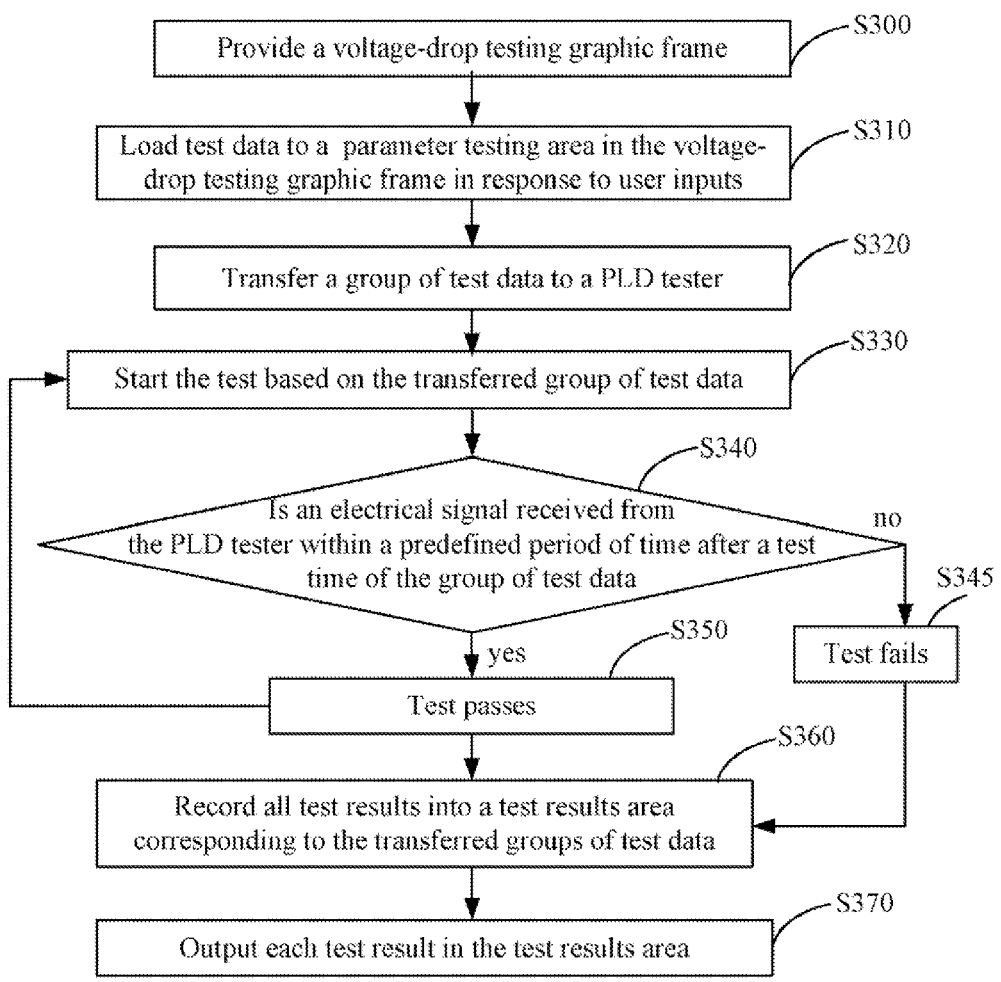
FIG. 5 is a flowchart of a voltage-drop testing method adapted for the voltage-drop testing system of FIG. 1.

FIG. 5 is a flowchart of a voltage-drop testing method adapted for the voltage-drop testing system of FIG. 1. In step S300, the test development platform 12 provides the voltage-drop testing graphic frame. In step 5310, the parameter loading module 210 loads test data to the parameter testing area in the voltage-drop testing graphic frame in response to user inputs. In step S320, the data transferring module 220 acquires one group of test data from the parameter testing area and transfers that group of test data to the PLD tester 20. In step S330, the PLD tester 20 starts the test based on the group of test data for the electronic device under test 2. In step S340, the determination module 230 determines whether or not an electrical signal is received from the PLD tester 20 within a predefined period of time after a test time of the group of test data.

In step S350, if the electrical signal is received within the predefined period of time from the PLD tester 20, the result recording module 240 records a "pass" test result in the test results area corresponding to the group of test data, and the procedure returns to step S320, that is, the PLD tester 20 continues to apply another group of test data in testing the electronic device 2. In step S345, if the electrical signal is not received within the predefined period of time from the PLD tester 20, the result recording module 240 records a "fail" result in the test results area in relation to that group of test data. In step S360, the result recording module 240 records all test results in the test results area for all groups of test data. In step S370, the output control module 250 outputs each test result in the test results area and controls the display unit 14 to display each test result.

When the test development platform 12 is running, each group of test data may be transferred to the PLD tester 20, when the PLD tester 20 has finished applying the testing based on all the groups of test data, the PLD tester 20 feeds back the test results to the test development platform 12, and the test development platform 12 integrates the test results for the electronic device under test 2 into the voltage-drop testing graphic frame. Therefore, the test results for the electronic device under test 2 are automatically entered in the voltage-drop testing graphic frame for the quick convenience of the user.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A voltage-drop testing system which is utilized to do an electromagnetic interference (EMI) test for an electronic device under test and runs in an environment comprising a power line disturbance (PLD) tester and a test development platform,
   wherein the PLD tester is connected with the electronic device under test, when receiving test data, the PLD tester starts the test for the electronic device under test, the test development platform provides a voltage-drop testing graphic frame which defines a parameter testing area and a test results area, and the parameter testing area comprises a supply voltage category, a listing of voltage-drop percentages, and increasing test times;
   the voltage-drop testing system comprising a voltage-drop control apparatus running on the test development platform, the voltage-drop control apparatus comprising a control unit, and the control unit comprising:
      a parameter loading module to load test data to the parameter testing area in the voltage-drop testing graphic frame in response to user inputs;
      a data transferring module to transfer the test data in the parameter testing area in groups to the PLD tester, each group of test data comprising a supply voltage, a voltage-drop percentage, and a test time;
      a determination module to determine whether or not an electrical signal from the PLD tester is received within a predefined period of time after a test time of one group of test data when the data transferring module transfers the group of test data to the PLD tester;
      a result recording module to identify a test result of passing into the test results area in relation to the group of test data when the electrical signal is received within the predefined period of time from the PLD tester, and a test result of failing into the test results area in relation to the group of test data when the electrical signal is not received within the predefined period of time from the PLD tester; and
      an output control module to output each test result in the test results area;
   wherein when the electrical signal is received within the predefined period of time from the PLD tester, the data transferring module is further configured to transfer another group of test data to the PLD tester.

2. The voltage-drop testing system as recited in claim 1, wherein when the electrical signal is not received within the predefined period of time from the PLD tester, the data transferring module is further configured to cease transferring groups of test data to the PLD tester.

3. A voltage-drop testing apparatus which is connected with a power line disturbance (PLD) tester and runs on a test development platform, the voltage-drop testing apparatus and the PLD tester are utilized to do an electromagnetic interference (EMI) test for a electronic device under test together,
   wherein the PLD tester is connected with the electronic device under test, when receiving test data, the PLD tester starts the test for the electronic device under test, the test development platform provides a voltage-drop testing graphic frame which defines a parameter testing area and a test results area, and the parameter testing area comprises a supply voltage category, a listing of voltage-drop percentages, and increasing test times;

the voltage-drop testing apparatus comprising a control unit, and the control unit comprising:
- a parameter loading module to load test data to the parameter testing area in the voltage-drop testing graphic frame in response to user inputs;
- a data transferring module to transfer the test data in the parameter testing area in groups to the PLD tester, each group of test data comprising a supply voltage, a voltage-drop percentage, and a test time;
- a determination module to determine whether or not an electrical signal is received from the PLD tester within a predefined period of time after a test time of one group of test data when the data transferring module transfers the group of test data to the PLD tester;
- a result recording module to record a test result of passing into the test results area in relation to the group of test data when the electrical signal is received within the predefined period of time from the PLD tester, and a test result of failing into the test results area in relation to the group of test data when the electrical signal is not received within the predefined period of time from the PLD tester; and
- an output control module to output each test result in the test results area;
- wherein when the electrical signal is received within the predefined period of time from the PLD tester, the data transferring module is further configured to transfer another group of test data to the PLD tester.

4. The voltage-drop testing apparatus as recited in claim 3, wherein when the electrical signal is not received within the predefined period of time from the PLD tester, the data transferring module is further configured to cease transferring groups of test data to the PLD tester.

5. A voltage-drop testing method adapted for a voltage-drop testing system, wherein the voltage-drop testing system is utilized to do an electromagnetic interference (EMI) test for an electronic device under test and runs in an environment comprising a power line disturbance (PLD) tester and a test development platform, the voltage-drop testing method comprising:
- providing a voltage-drop testing graphic frame which defines a parameter testing area and a test results area via the test development platform, wherein the parameter testing area comprises a supply voltage category, a listing of voltage-drop percentages, and increasing test times;
- loading test data to the parameter testing area in the voltage-drop testing graphic frame in response to user inputs via a control unit of a voltage-drop testing apparatus of the voltage-drop testing system;
- transferring the test data in the parameter testing area in groups to the PLD tester via the control unit of the voltage-drop testing apparatus, wherein each group of test data comprising a supply voltage, a voltage-drop percentage, and a test time;
- determining whether or not an electrical signal is received from the PLD tester within a predefined period of time after a test time of one group of test data when transferring the group of test data to the PLD tester via the control unit of the voltage-drop testing apparatus;
- if the electrical signal is received within the predefined period of time from the PLD tester, recording a test result of passing into the test results area in relation to the group of test data and transferring another group of test data to the PLD tester via the control unit of the voltage-drop testing apparatus;
- if the electrical signal is not received within the predefined period of time from the PLD tester, recording a test result of failing into the test results area in relation to the group of test data via the control unit of the voltage-drop testing apparatus; and
- outputting each test result in the test results area via the control unit of the voltage-drop testing apparatus.

6. The voltage-drop testing method as recited in claim 5, further comprising:
- if the electrical signal is not received within the predefined period of time from the PLD tester, ceasing transferring groups of test data to the PLD tester via the control unit of the voltage-drop testing apparatus.

\* \* \* \* \*